(12) United States Patent
Furukawa et al.

(10) Patent No.: US 8,138,100 B2
(45) Date of Patent: Mar. 20, 2012

(54) MICROELECTRONIC STRUCTURE BY SELECTIVE DEPOSITION

(75) Inventors: Toshiharu Furukawa, Essex Junction, VT (US); Steven J. Holmes, Guilderland, NY (US); David V. Horak, Essex Junction, VT (US); Charles W. Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 748 days.

(21) Appl. No.: 12/273,908

(22) Filed: Nov. 19, 2008

(65) Prior Publication Data

US 2009/0075439 A1    Mar. 19, 2009

Related U.S. Application Data

(63) Continuation of application No. 11/307,294, filed on Jan. 31, 2006, now Pat. No. 7,510,939.

(51) Int. Cl.
*H01L 21/00* (2006.01)
(52) U.S. Cl. .......... 438/763; 438/596; 438/157
(58) Field of Classification Search ............... 438/157, 438/763, 596
See application file for complete search history.

(56) References Cited

U.S. PATENT DOCUMENTS

| | | | |
|---|---|---|---|
| 6,998,332 B2* | 2/2006 | Furukawa et al. | 438/585 |
| 7,166,859 B2* | 1/2007 | Hirose et al. | 257/40 |
| 7,229,889 B2* | 6/2007 | Holmes et al. | 438/396 |
| 7,329,613 B2* | 2/2008 | Furukawa et al. | 438/763 |
| 7,345,370 B2* | 3/2008 | Furukawa et al. | 257/784 |
| 7,384,838 B2* | 6/2008 | Hsu et al. | 438/230 |
| 7,387,974 B2* | 6/2008 | Holmes et al. | 438/780 |
| 7,510,939 B2* | 3/2009 | Furukawa et al. | 438/283 |
| 7,521,808 B2* | 4/2009 | Furukawa et al. | 257/774 |
| 7,816,743 B2* | 10/2010 | Furukawa et al. | 257/401 |
| 2005/0104097 A1* | 5/2005 | Hirose et al. | 257/288 |
| 2005/0153562 A1* | 7/2005 | Furukawa et al. | 438/694 |
| 2006/0097310 A1* | 5/2006 | Kim et al. | 257/321 |
| 2006/0154463 A1* | 7/2006 | Furukawa et al. | 438/596 |
| 2006/0202239 A1* | 9/2006 | Holmes et al. | 257/288 |
| 2006/0205123 A1* | 9/2006 | Holmes et al. | 438/149 |
| 2006/0205226 A1* | 9/2006 | Furukawa et al. | 438/763 |
| 2007/0207604 A1* | 9/2007 | Furukawa et al. | 438/596 |
| 2008/0001225 A1* | 1/2008 | Furukawa et al. | 257/347 |

(Continued)

OTHER PUBLICATIONS

Gordon, et al., "Vapor Deposition of Metal Oxides and Silicates: Possible Gate Insulators for Future Microelectronics" 2001 Chemical Society, Chem. Mater., Jul. 10, 2001, pp. 2463-2464, vol. 13, No. 8, published on Web.

(Continued)

*Primary Examiner* — Laura Menz
(74) *Attorney, Agent, or Firm* — Scully, Scott, Murphy & Presser, P.C.; Joseph P. Abate, Esq.

(57) ABSTRACT

A finFET structure includes a semiconductor fin located over a substrate. A gate electrode is located traversing the semiconductor fin. The gate electrode has a spacer layer located adjoining a sidewall thereof. The spacer layer does not cover completely a sidewall of the semiconductor fin. The gate electrode and the spacer layer may be formed using a vapor deposition method that provides for selective deposition upon a sidewall of a mandrel layer but not upon an adjoining surface of the substrate so that the spacer layer does not cover completely the sidewall of the semiconductor fin. Other microelectronic structures may be fabricated using the lateral growth methodology.

10 Claims, 5 Drawing Sheets

U.S. PATENT DOCUMENTS

2009/0072317 A1* 3/2009 Furukawa et al. ............ 257/365
2009/0075439 A1* 3/2009 Furukawa et al. ............ 438/157
2009/0314015 A1* 12/2009 Minor et al. .................... 62/115

OTHER PUBLICATIONS

Utriainen, et al., "Studies of metallic thin film growth in an atomic layer epitaxy reactor using M(acac)2 (M=Ni, Cu, Pt) precursors", Applied Surface Science 157 (2000) pp. 151-158.

Scmaltianos, et al., "Copper nucleation by chemical vapour deposition on organosilane treated SiO2 surfaces", Surface Science 562 (2004), pp. 157-169.

Lim, et al., "Synthesis and Characterization of Volatile, Thermally Stable, Reactive Transition Metal Amidinates", Inorganic Chemistry 2003, pp. 7951-7958, vol. 42, No. 24.

Yokoyama, et al., "Atomic-layer selective deposition of silicon nitride on hydrogen-terminated Si surfaces", Applied surface Science 130-132 (1998) pp. 352-356.

Jain, et al., "Control of selectivity during chemical vapor deposition of copper from copper (I) compounds via silicon dioxide surface modification", Appl. Phys. Lett. 61 (22), Nov. 30, 1992, pp. 2662-2664.

Fail, et al., "Controlled Attachment of PAMAM Dendrimers to Solid Surfaces", 2002 American Chemical Society, Dec. 6, 2001, pp. 264-268, Published on Web.

Hausmann, et al., "Rapid Vapor Deposition of Highly Conformal Silica Nanolaminates", Oct. 11, 2002, pp. 402-406, vol. 298, Science.

Klaus, et al., "Atomic Layer Deposition of Tungsten Nitride Films Using Sequential Surface Reactions", Journal of the Electrochemical Society, 147, (3) 1175-1181 (2000).

Marcinko, et al., "Hydrolytic Stability of Organic Monolayers Supported on TiO2 and ZrO2", 2004 American Chemical Society; pp. 2270-2273.

Becker, et al., "Diffusion barrier properties of tungsten nitride films grown by atomic layer deposition from bis(tert-butylimido)bis(dimethylamido)tungsten and ammonia," Applied Physics Letters, Apr. 7, 2003, pp. 2239-2241, vol. 82, No. 14; downloaded Nov. 25, 2003 to 128.103.60.225.

Smith, et al., "Physical and electrical characterization of ALCVDTM TiN and WNxCy used as a copper diffusion barrier in dual damascene backend structures (08.2)", 2002 Elsevier Science B.V. Microelectronic Engineering 64 (202) 247-253.

\* cited by examiner

MICROELECTRONIC STRUCTURE BY SELECTIVE DEPOSITION

RELATED APPLICATION

This application is a continuation of U.S. patent application Ser. No. 11/307,294, filed Jan. 31, 2006.

BACKGROUND

1. Field of the Invention

The invention relates generally to microelectronic structures. More particularly, the invention relates to selective methods for forming microelectronic structures.

2. Description of the Related Art

As semiconductor device technology continues to advance, a need exists for semiconductor devices that provide enhanced performance within limited semiconductor substrate area. A class of semiconductor devices that has recently evolved to meet the foregoing performance and density needs is known as finFET devices.

finFET devices are semiconductor devices that comprise a semiconductor fin located edgewise upon a substrate. A pair of gate dielectric layers is typically located one each upon both major vertical surfaces, and optionally also contiguously upon a top surface, of the semiconductor fin. An inverted U shaped gate electrode often straddles a central section of the semiconductor fin and covers the gate dielectric layers. In other instances, a portion of a gate electrode is not located atop the semiconductor fin, and thus a pair of gate electrodes is restricted to the sidewalls of the semiconductor fin. End portions of the semiconductor fin uncovered by the gate electrode are typically subject to ion implantation while using the gate electrode or other masking layer as a mask, to thus provide source/drain regions within the semiconductor fin that are separated by a channel region located beneath or covered by the gate electrode(s) within the semiconductor fin.

finFET devices provide several advantages in comparison with conventional planar field effect transistor devices. In particular, since finFET devices are vertical channel devices, they may be scaled effectively in the vertical direction, while not using any additional semiconductor substrate area. Thus, finFET devices offer an opportunity for enhanced semiconductor device performance absent an increase in aerial dimensions.

finFET devices clearly provide a novel approach for increasing semiconductor device performance. However, finFET devices are not entirely without difficulty. finFET fabrication generally involves forming a gate electrode having a considerable thickness upon a semiconductor fin that might also be readily scaled to a considerable height. The topography induced by the crossing of such a fin structure with such a gate structure may, under certain circumstances, provide fabrication difficulties.

A need thus exists for providing finFET structures, and methods for fabrication thereof that are readily manufacturable.

SUMMARY OF THE INVENTION

The invention provides a finFET structure, a method for fabricating the finFET structure and a method for fabricating a microelectronic structure that need not necessarily be a finFET structure. The structure and the first method may use a laterally selective deposition method that, in turn, uses a vertical sidewall activated mandrel layer located upon a horizontal surface passivated (i.e., inactivated) substrate within the context of finFET gate structure fabrication. The second method uses the vertical sidewall activated mandrel layer laterally selective deposition aspects of the invention, but not necessarily within the context of finFET structure fabrication.

A semiconductor structure in accordance with the invention comprises a semiconductor fin located over a substrate. The semiconductor structure also comprises a gate electrode located traversing the semiconductor fin. The gate electrode has a spacer layer located adjacent a sidewall thereof. The spacer layer does not cover completely a sidewall of the semiconductor fin remote from the gate electrode.

A related method for fabricating a semiconductor structure in accordance with the invention provides for forming a semiconductor fin over a substrate. The method also provides for forming a gate electrode over the substrate and traversing a portion of the semiconductor fin. Finally, the method also provides for forming a spacer layer over the substrate and also traversing a portion of the semiconductor fin. Within the method, the spacer layer is adjacent a sidewall of the gate electrode, but the spacer layer does not cover completely a sidewall of the semiconductor fin remote from the gate electrode.

Finally, a second method for forming a microelectronic structure in accordance with the invention provides for forming a mandrel layer over a substrate. A sidewall of the mandrel layer is activated with respect to vapor deposition of a material layer upon the sidewall of the mandrel layer. A surface of the substrate is passivated with respect to vapor deposition of the material layer upon the surface of the substrate. The method also provides for vapor depositing and selectively laterally growing the material layer upon the sidewall of the mandrel layer but not upon the surface of the substrate.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a finFET structure, a method for fabricating the finFET structure and a method for fabricating a microelectronic structure that need not necessarily be a finFET structure. The structure and the first method may use a laterally selective deposition method that, in turn, uses a vertical sidewall activated mandrel layer located upon a horizontal surface passivated (i.e., inactivated) substrate within the context of finFET gate fabrication. The second method uses the sidewall selective lateral deposition aspects of the invention, but not necessarily within the context of finFET fabrication.

FIG. 1 to FIG. 18 show a series of schematic cross-sectional and plan-view diagrams illustrating the results of progressive stages in fabricating a finFET structure in accordance with a preferred embodiment of the invention.

Figure 1:
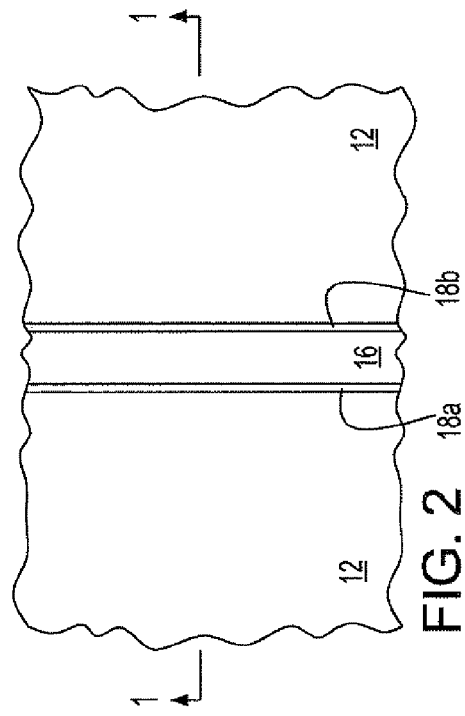
FIG. 1 to FIG. 18 show a series of schematic cross-sectional and plan-view diagrams illustrating the results of progressive stages in fabricating a finFET structure in accordance with a preferred embodiment of the invention.
Figure 2:
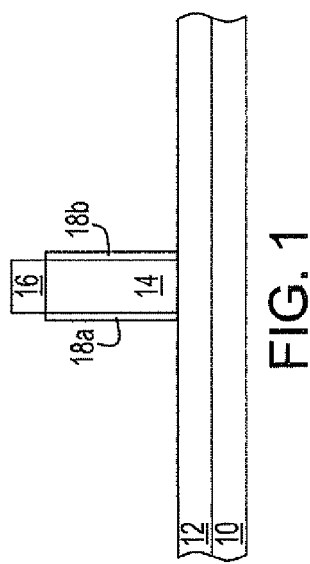

FIG. 1 and FIG. 2 show, respectively, a schematic cross-sectional diagram and a schematic plan-view diagram of the finFET structure at an early stage in its fabrication. FIG. 1 in particular shows a substrate 10. A dielectric layer 12 is located upon the substrate 10. A semiconductor fin 14 is located upon the dielectric layer 12. A patterned hard mask layer 16 is located upon the semiconductor fin 14. Finally, a pair of gate dielectric layers 18a and 18b is located upon a pair of opposite sidewalls of the semiconductor fin 14.

Each of the foregoing substrate 10 and layers may comprise materials and have dimensions that are conventional in the semiconductor fabrication art. Each of the foregoing substrate 10 and layers may also be formed using methods that are conventional in the semiconductor fabrication art.

The substrate 10 typically comprises a semiconductor material, although the invention is not so limited. The substrate 10 may alternatively comprise a conductor material or a dielectric material. Non-limiting examples of semiconductor materials which may be used as the substrate 10 include, silicon, germanium, silicon-germanium alloy, silicon carbide, silicon-germanium carbide and compound (i.e., II-VI and III-V) semiconductor materials. Non-limiting examples of compound semiconductor materials include gallium arsenide, indium arsenide and indium phosphide semiconductor materials. Typically, the substrate 10 comprises a silicon or silicon-germanium alloy (e.g., typically from about 25 to about 35 atomic percent germanium) semiconductor material having a thickness from about 1 to about 3 mils.

The dielectric layer 12 serves as a substrate layer for a finFET structure fabricated in accordance with the instant embodiment. The dielectric layer 12 may comprise any of several dielectric materials. Non-limiting examples include oxides, nitrides and oxynitrides, typically of silicon, but oxides, nitrides and oxynitrides of other elements are also not excluded. The dielectric layer 12 may be formed using any of several methods. Non-limiting examples include thermal or plasma oxidation methods, thermal or plasma nitridation methods, chemical vapor deposition methods and physical vapor deposition methods. Typically, the dielectric layer 12 comprises a silicon or silicon-germanium alloy oxide material that has a thickness from about 200 to about 1000 angstroms.

The semiconductor fin 14 also comprises a semiconductor material. The semiconductor material may be selected from the same group of semiconductor materials from which is comprised the substrate 10, when the substrate 10 comprises a semiconductor material. The substrate 10 and the semiconductor fin 14 may comprise the same or different semiconductor materials with respect to chemical composition, dopant concentration and crystallographic orientation. Typically, the semiconductor fin 14 has a linewidth from about 500 to about 700 angstroms and a height from about 1000 to about 5000 angstroms. Typically the semiconductor fin 14 comprises a silicon or silicon-germanium alloy semiconductor material.

The patterned hard mask layer 16 may comprise a hard mask material that is otherwise generally conventional in the semiconductor fabrication art. Oxide, nitride and oxynitride hard mask materials are common, but by no means limiting. The patterned hard mask layer 16 may, in some instances, be formed using methods and materials analogous, equivalent or identical to the methods and materials used for forming the dielectric layer 12. Preferably, the patterned hard mask layer 16 comprises a silicon nitride hard mask material that has a thickness from about 200 to about 500 angstroms.

The pair of gate dielectric layers 18a and 18b may comprise a generally conventional dielectric material having a dielectric constant from about 4 to about 20, measured in vacuum. Such a dielectric material may comprise a silicon oxide, a silicon nitride or a silicon oxynitride dielectric material. Alternatively, the pair of gate dielectric layers 18a and 18b may comprise a generally higher dielectric constant dielectric material having a dielectric constant from about 20 to at least about 100. Such higher dielectric constant dielectric materials include, but are not limited to: hafnium oxides, hafnium silicates, titanium oxides, barium strontium titanates (BSTs) and lead zirconate titanates (PZTs). The gate dielectric layers 18a and 18b may be formed using methods that are appropriate to their materials of composition. The methods may include, but are not limited to: thermal oxidation or nitridation methods, plasma oxidation or nitridation methods, chemical vapor deposition methods and physical vapor deposition methods. Typically, each of the pair of gate dielectric layers 18a and 18b comprises a silicon oxide material having a thickness from about 20 to about 70 angstroms. Preferably, the silicon oxide material is formed using a thermal oxidation method.

When the substrate 10 comprises a semiconductor material, the semiconductor structure of FIG. 1 and FIG. 2 may be fabricated by using a semiconductor-on-insulator substrate. A semiconductor-on-insulator substrate comprises: (1) a semiconductor substrate (i.e., the substrate 10); (2) a buried dielectric layer located upon the semiconductor substrate (i.e., the dielectric layer 12); and (3) a surface semiconductor layer (i.e., from which is formed the semiconductor fin 14) located upon the buried dielectric layer. A blanket hard mask layer is then located upon the surface semiconductor layer. A patterned photoresist layer is located upon the blanket hard mask layer, and the blanket hard mask layer is patterned to form the patterned hard mask layer 16. At least the patterned hard mask layer 16 is then used for forming the semiconductor fin 14 from the surface semiconductor layer within the semiconductor-on-insulator substrate. Once the semiconductor fin 14 is patterned from the surface semiconductor layer while using the patterned hard mask layer as an etch mask layer, the semiconductor fin 14 may be thermally oxidized to form the pair of gate dielectric layers 18a and 18b.

Semiconductor-on-insulator substrates may be fabricated using any of several methods. Non-limiting examples include lamination methods, layer transfer methods and separation by implantation of oxygen (SIMOX) methods. The instant embodiment is not limited to use of only semiconductor-on-insulator substrates. Rather the embodiment also contemplates use of at least bulk semiconductor substrates and bulk dielectric substrates (i.e., a dielectric substrate consisting of only a dielectric material, and absent a conductor material or a semiconductor material) when fabricating thereupon or thereover semiconductor structures, non-limiting examples of which include finFET structures (i.e., finFET gate structures).

Figure 3:
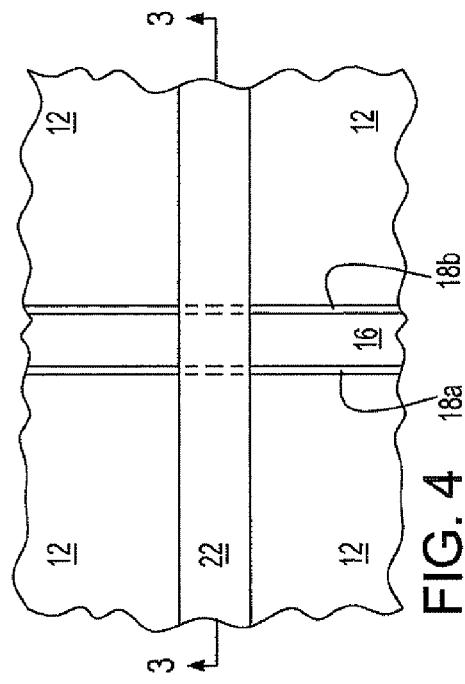
Figure 4:

FIG. 3 and FIG. 4 show a schematic cross-sectional and schematic plan-view diagram illustrating the results of further processing of the semiconductor structure whose schematic cross-sectional and plan-view diagrams are illustrated in FIG. 1 and FIG. 2.

FIG. 3 shows a patterned capping layer 22 located aligned upon a patterned mandrel layer 20. In turn, the patterned mandrel layer 20 encapsulates a portion of the semiconductor fin 14, the patterned hard mask layer 16 and the pair of gate dielectric layers 18a and 18b. FIG. 4 further shows that the patterned capping layer 22 traverses a central portion of the patterned hard mask layer 16, and thus also a central portion of the semiconductor fin 14 aligned therebeneath. Sidewall and top portions of the patterned capping layer 22 are exposed, as are sidewall portions of the patterned mandrel layer 20 and top portions of the dielectric layer 12.

The patterned mandrel layer 20 comprises a mandrel material that is either: (1) intrinsically active with respect to a vapor deposition method for forming a particular material layer upon a sidewall of the patterned mandrel layer 20; or alternatively (2) readily activatable with respect to the vapor deposition method for forming the particular material layer upon the sidewall of the patterned mandrel layer 20.

As a general rule and within the context of the instant embodiment and the invention, a mandrel material is either: (1) intrinsically "active"; or (2) otherwise "activatable," if it either: (1) intrinsically comprises; or (2) may be chemically modified to comprise, surface chemical functionality that provides for enhanced deposition of the particular material layer upon the active or activatable sidewall surface of the patterned mandrel layer 20. Enhanced deposition is typically realized with respect to active or activatable surfaces that comprise an organic acid, hydroxyl or amine functionality. Amine functionality is often quite desirable. Retarded deposition (i.e, "inactive" surface or "passive" surface) is typically realized with respect to passive or passivatable surfaces that comprise chemically non-functional organic (i.e., typically alkyl) surfaces. In accordance with the foregoing options, the patterned mandrel layer 20 will thus typically have a desirable generally wettable surface (i.e., organic acid, hydroxyl or amine functionality that provides a sessile water drop contact angle of less than about 30 degrees). For comparison, a non-wettable surface (i.e., non-functional organic such as alkyl providing a surface having a sessile water drop contact angle of greater than about 90 degrees) will typically yield a retarded or inhibited deposition of a particular material layer thereupon while using a vapor deposition method.

Thus, the patterned mandrel layer 20 preferably comprises a mandrel material that is either: (1) intrinsically chemically functional to provide a wettable surface with respect to a vapor deposition method; or in the alternative (2) readily functionizable to provide a wettable surface with respect to the vapor deposition method. Again, amine functionality is a particularly preferred chemical functionality for providing the wettable surface.

While by no means a limitation of the invention, a patterned mandrel layer 20 comprising or consisting of an anhydride material, and in particular a maleic anhydride material (i.e., intended as a polymerized maleic anhydride material, a co-polymer of a maleic anhydride material, or in general a polymer containing an anhydride functionality or a similar reactive group functionality) may be advantageously used within the context of the invention. In accordance with further disclosure below, the maleic anhydride material may be efficiently treated with a multi-functional amine to provide the wettable amine rich surface that is advantageously desirable within the context of the instant embodiment. The maleic anhydride material may be deposited using methods that are conventional in the semiconductor fabrication art. Such methods may include, but are not limited to: thermal vapor deposition (i.e., evaporation) methods, plasma deposition methods, spin coating methods and solvent casting methods. Preferably, the patterned mandrel layer 20 has a thickness from about 3000 to about 7000 angstroms, which completely encapsulates the semiconductor fin 14 and the patterned hard mask layer 16. Nonetheless, the invention is not so limited, and lesser thicknesses for the patterned mandrel layer 20 may be used. Also, the patterned mandrel layer 20 has a linewidth from about 0.1 to about 0.3 microns.

As an alternative, a patterned mandrel layer comprising or consisting of a polymerized hydroxysiloxane material may also be used. In addition, oxygen plasmas, oxidizing acids (i.e., sulfuric acid and nitric acid) and peroxides such as hydrogen peroxide may be used to provide oxidized activated mandrel layer surfaces. Finally, introduction of metal additives into mandrel materials may also assist in providing activated surfaces for vapor depositing material layers thereupon.

The patterned capping layer 22 may comprise capping materials analogous, equivalent or identical to the hard mask materials from which are comprised the patterned hard mask layer 16. Silicon oxides, silicon nitrides and silicon oxynitrides are common, but for reasons that are disclosed in further detail below silicon nitride materials are desirable for both the patterned hard mask layer 16 and the patterned capping layer 22. Typically, the patterned capping layer 22 has a thickness from about 100 to about 500 angstroms. Typically, the patterned capping layer 22 is formed using a chemical vapor deposition or physical vapor deposition method at a temperature sufficiently low so that there is no detrimental effect upon the patterned mandrel layer 20.

To form the semiconductor structure whose schematic cross-sectional and plan-view diagrams are illustrated in FIG. 3 and FIG. 4 from the semiconductor structure whose schematic cross-sectional and plan-view diagrams are illustrated in FIG. 1 and FIG. 2, a blanket mandrel material layer is first located upon the semiconductor structure whose schematic cross-sectional and plan-view diagrams are illustrated in FIG. 1 and FIG. 2. A blanket capping layer is then located upon the blanket mandrel layer. A patterned photoresist layer is then located upon the blanket capping layer. The blanket capping layer is patterned to form the patterned capping layer 22 while using the patterned photoresist layer as an etch mask. At least the patterned capping layer 22 is then used as an etch mask for forming the patterned mandrel layer 20 from the blanket mandrel layer. Often, the patterned photoresist layer may be simultaneously stripped from the patterned capping layer 22 when an oxygen containing plasma is used for etching the blanket mandrel layer when forming the patterned mandrel layer 20. The foregoing process sequence is exemplary only, and by no means does the process sequence limit either the instant embodiment or the invention.

Figure 6:
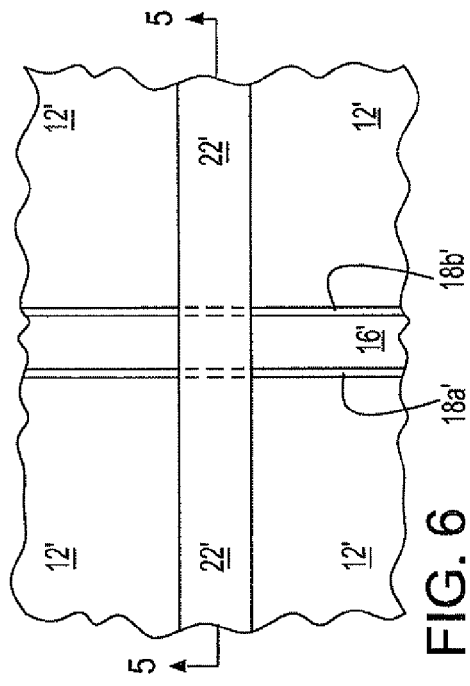
Figure 5:
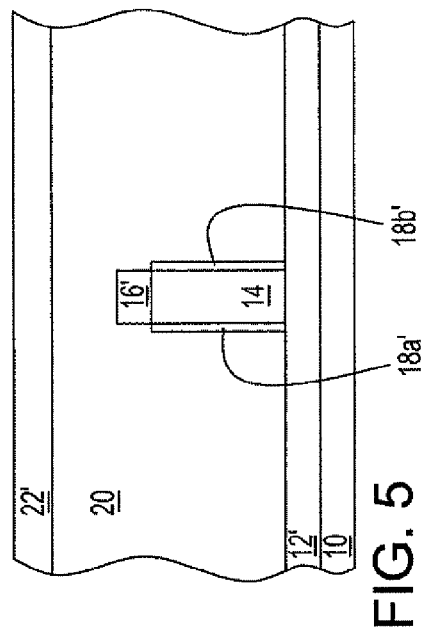

FIG. 5 and FIG. 6 show a pair of schematic cross-sectional and plan-view diagrams illustrating the results of further processing of the semiconductor structures whose schematic cross-sectional and plan-view diagrams are illustrated in FIG. 3 and FIG. 4.

FIG. 5 and FIG. 6 show: (1) a passivated dielectric layer 12'; (2) a passivated patterned hard mask layer 16'; (3) a pair of passivated gate dielectric layers 18a' and 18b'; and (4) a passivated patterned capping layer 22' that are formed, respectively, from: (1) the dielectric layer 12, (2) the patterned hard mask layer 16; (3) the pair of gate dielectric layers 18a and 18b; and (4) the patterned capping layer 22 that are illustrated in FIG. 3 and FIG. 4. Within the context of the instant embodiment, passivating each of the foregoing layers to provide each of the corresponding foregoing passivated layers is intended to include a treatment or modification of each of the layers. The treatment or modification provides each of the exposed surfaces of each of the resulting passivated layers with a considerably decreased sensitivity for forming a deposited material layer thereupon while using a particular vapor deposition method. Particular types of material layers that may be deposited, and particular types of vapor deposition methods that may be used for depositing the particular types of material layers, are disclosed in further detail below.

Within the instant embodiment, passivation is effected by treating: (1) the exposed top surface of the dielectric layer 12; (2) the exposed top and sidewall surfaces of the patterned hard mask layer 16; (3) the exposed sidewall surfaces of the pair of gate dielectric layers 18a and 18b; and (4) the exposed top and sidewall surfaces of the patterned capping layer 22, so that the indicated surfaces of the foregoing layers 12, 16, 18a and 18b, and 22 (when treated) do not have a chemical functionality that promotes formation of the aforementioned material layer deposited by the vapor deposition method. In accord with further disclosure above, such a deposition inhibiting (i.e., passivating) chemical surface is generally a non-functional organic surface (i.e., an alkylated surface). The alkyl (or other non-functional organic surface) generally provides a non-wettable surface.

Within the context of a silicon oxide surface or a silicon nitride surface that is desired to be passivated to provide an alkylated surface, the invention contemplates use of any of a number of substituted silane materials as silicon oxide or silicon nitride surface alkylating agents. The silane materials that are surface alkylating agents within the context of the invention are desirably not deactivating to a patterned mandral layer of a materials composition disclosed above.

Specific but not limiting examples of substituted silane surface alkylating agents include dimethyl-bis-acetato silane, methyl-tris-acetato silane, neopentyl-tris-acetato silane, di-neopentyl-bis-acetato silane, phenyl-tris-acetato silane, di-phenyl-bis-acetato silane. Also included are analogous substituted silane surface alkylating agents in which an acetate (i.e., acetato) functionality is substituted with an isocyanato-, trifluoroacetato-, methylsulfonato- (or alkylsulfonato-), thiocyanato-, triflatato-, iodo-, bromo-, chloro- or related functionality.

Certain analogous phosphonato-materials may be used as alternative surface alkylating agents.

With respect to substituted silane surface alkylating agents comprising acetate functionality, any reaction with an anhydride polymer (such as a maleic anhydride polymer), or with serendipitous carboxylic acid groups on a patterned mandrel layer surface, would be expected to produce a secondary anhydride (or reactive silicon containing) group. A complete reaction and quenching of a primary anhydride functionality to yield a passivated (i.e., unreactive) mandral layer surface is not anticipated within the context of the invention.

Treatment with the foregoing surface alkylating agents may be undertaken using any of several methods. Non-limiting examples of methods include: (1) vapor immersion methods (i.e., from about 10 to about 100 volume percent within an inert carrier gas, and possibly at elevated pressures); and (2) dilute (i.e., from about 5 to about 30 weight percent) solution immersion methods and spin coating methods. Typically, a silicon oxide or silicon nitride surface is treated with a surface alkylating agent and then thermally annealed at a temperature of about 100° C. to about 200° C. to assure adequate surface reaction and functionalization.

Figure 8:
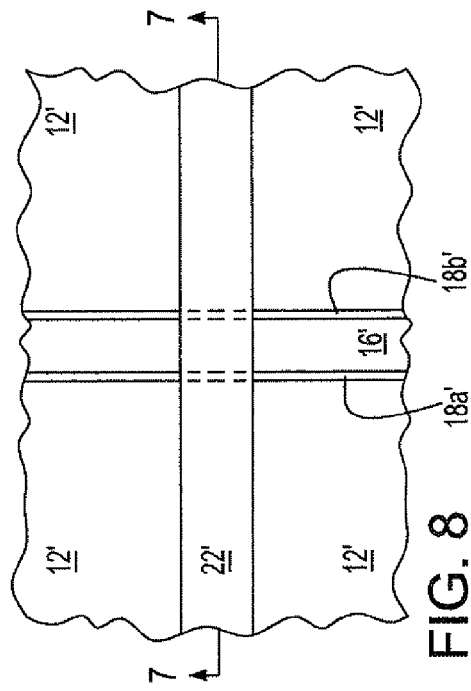
Figure 7:
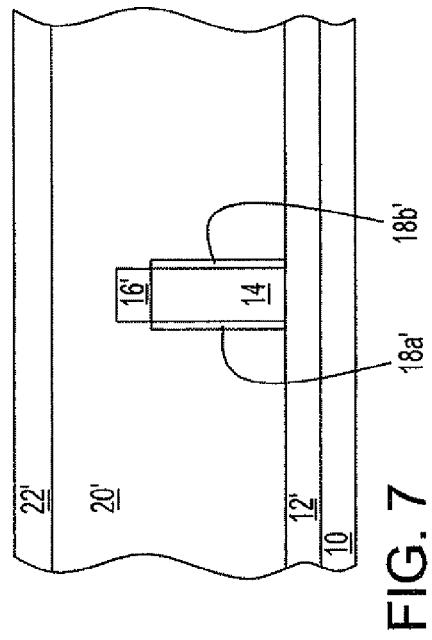

FIG. 7 and FIG. 8 show a pair of schematic cross-sectional and plan-view diagrams illustrating the results of further processing of the semiconductor structure whose schematic cross-sectional and plan-view diagrams are illustrated in FIG. 5 and FIG. 6.

In particular, FIG. 7 shows an activated patterned mandrel layer 20' that results from activating the patterned mandrel layer 20 that is illustrated in FIG. 5. The activated patterned mandrel layer 20' is otherwise located aligned beneath the passivated patterned capping layer 22' that is illustrated in FIG. 8.

Activation of the patterned mandrel layer 20 to provide the activated patterned mandrel layer 20' is undertaken within the context of the disclosure above. Activation of the patterned mandrel layer 20 to provide the activated patterned mandrel layer 20' provides the activated patterned mandrel layer 20' with a chemical functionality that provides a wettable surface that promotes deposition of a material layer thereupon while using a vapor deposition method. In accordance with disclosure above, desirable chemical functionality to provide such an activated surface is generally an organic acid, alcohol or amine functionality.

Within the context of the instant embodiment, an amine activating surface functionality for the activated patterned mandrel layer 20' may be effected by surface reaction of a multifunctional amine with the polymerized maleic anhydride material from which is preferably comprised the patterned mandrel layer 20. Suitable multifunctional amines may include, but are not limited to: ethylene diamine, ethylene triamine and other alkyl multiamines, as well as polyamidoamine dendrimers (available from Aldrich Chemical as Starburst Dendrimer™ comprising a 10% w/v solution in methanol). Such a suitable amine may be surface reacted with the preferred polymerized maleic anhydride material from which is comprised the patterned mandrel layer 20 while using any of several methods. The methods may include, but are not limited to: thermally activated vapor phase treatment methods, spin coating methods and solution treatment methods. Solution treatment methods are generally preferred. For spin coating methods and solution treatment methods, typical concentrations of multifunctional amine range from about 5 to about 30 weight percent in a polar solvent. The polar solvent may be an aqueous based solvent, an alcohol based solvent (e.g., methanol, ethanol, propanol or higher alcohol) or any other polar solvent that does not detrimentally affect the mandrel material, but in which an appropriate amine is soluble. Surface treatment times may range from about 1 to about 20 minutes. Post-treatment curing temperatures ranging from about 100° to about 125° C. are common. A post-treatment solvent rinse may be desirable to remove excess amine from a treated surface, and to enhance selectivity.

Figure 9:
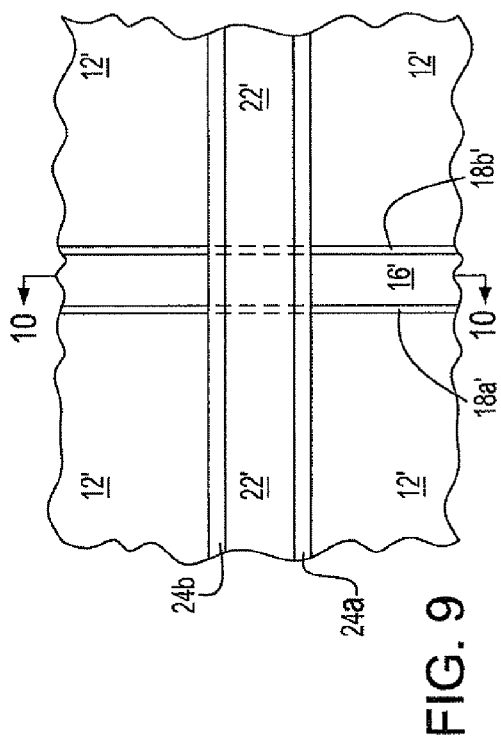
Figure 10:
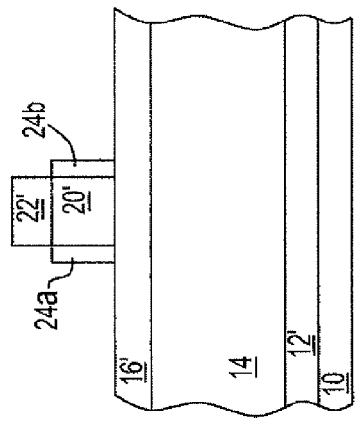

FIG. 9 and FIG. 10 show a pair of schematic cross-sectional and plan-view diagrams illustrating the results of further processing of the semiconductor structure whose schematic cross-sectional and plan-view diagrams are illustrated in FIG. 7 and FIG. 8.

FIG. 9 and FIG. 10 show a pair of laterally grown first spacer material layers 24a and 24b located and formed laterally adjacent (and adjoining) a pair of opposite sidewalls of the activated patterned mandrel layer 20'. The pair of laterally grown first spacer material layers 24a and 24b intrinsically do not grow: (1) upon exposed horizontal surfaces of the passivated dielectric layer 12'; (2) nor upon the exposed horizontal and vertical surfaces of the passivated patterned hard mask layer 16'; (3) nor upon the exposed vertical surfaces of the passivated gate dielectric layers 18a' and 18b'; (4) nor upon the exposed sidewall or top surfaces of the passivated patterned capping layer 22'. Rather the pair of laterally grown first spacer material layers 24a and 24b grow laterally away from the activated patterned mandrel layer 20' vertical surfaces only. As a result of this lateral growth, portions of the laterally grown first spacer material layers 24a and 24b cover portions of the passivated dielectric layer 12', the passivated patterned hard mask layer 16' and the passivated gate dielectric layers 18a' and 18b' upon which they would otherwise not grow.

The pair of laterally grown first spacer material layers 24a and 24b many comprise any of several spacer materials. Non-limiting examples of spacer materials include conductor, semiconductor and dielectric spacer materials. Semiconductor spacer materials are not particularly common within the context of the instant embodiment, but they are nonetheless also not excluded. Rather, both dielectric spacer materials and conductor spacer materials are both more desirable and more common. Dielectric spacer materials may comprise oxide, nitride or oxynitride dielectric spacer materials, although other dielectric spacer materials are not excluded. Oxide spacer materials are common. Conductor spacer materials may comprise certain metals or metal alloys, but are more likely to include certain metal silicides and certain metal nitrides. Other conductor spacer materials are also not excluded.

Particular examples of deposition methods for dielectric spacer materials, including silicon oxide, are taught within Gordon et al., in U.S. Publication No. 2004/0043149. In particular for silicon oxide materials, an atomic layer deposition method may be undertaken by using alternating doses of tetraisocyanatosilane and tris(tert-butoxy)silanol. As a preferred alternative, an appropriate substrate (such as a preferred amine treated maleic anhydride patterned mandral layer substrate) may be first treated with a trimethyl aluminum activant, followed by deposition of a silicon oxide material while using a single cycle deposition method that uses a tris(tert-butoxy)silanol starting material. A deposition temperature of 200-250° C. is preferred, with 200-225° C. more preferred. The use of a single cycle deposition method is desirable since such a process has enhanced selectivity and a reduced opportunity for nucleation is undesired areas. Deposition pressures from about 0.1 to about 1.0 torr are common. Flow rates from about 1 e-10 to 1 e-8 moles of active reactant per square centimeter surface area are also common. Individual reactant cycle times from about 2 to about 10 seconds are similarly also common.

Metal nitride layers and metal silicide layers may be deposited while using related deposition conditions and limitations. McElwee-White et al. in U.S. Pub. No. 2002/0045343 in particular teach the use of single imido tungsten imido precursors (i.e., W(NR)(X)y(L)5−y) for forming tungsten nitride layers while using a metal-organic chemical vapor deposition method. The precursors are hexa-coordinate, and the five remaining ligands X and L may comprise several chemical moieties other than imido moieties. Cabral Jr, et al., in U.S. Pat. No. 6,943,097 teach the use of: (1) group IVB (i.e., titanium, zirconium or hafnium) and VB (i.e., vanadium, niobium or tantalum) metal halides; (2) silanes of one to ten silicon atoms; and (3) optionally activated nitrogen materials, as source materials for forming conductor metal silicides and conductor metal silicide nitrides while using an atomic layer deposition method.

Atomic layer deposition methods may also be used for depositing layers comprising metals such as copper, nickel or platinum. Deposition conditions similar to those cited above may be used. The layers may often be deposited using acetylacetonate coordination complexes of the appropriate metals.

Typically, the pair of laterally grown first spacer material layers 24a and 24b comprises a silicon oxide material or other dielectric material. Each of the pair of laterally grown first spacer material layers 24a and 24b has a thickness from about 50 to about 200 angstroms. Each of the pair of laterally grown first spacer material layers 24a and 24b may be formed using any of several vapor deposition methods beyond the specific method outlined above. Non-limiting examples include physical vapor deposition methods as well as chemical vapor deposition methods that may include, but are not limited to, atomic layer deposition methods.

Figure 11:
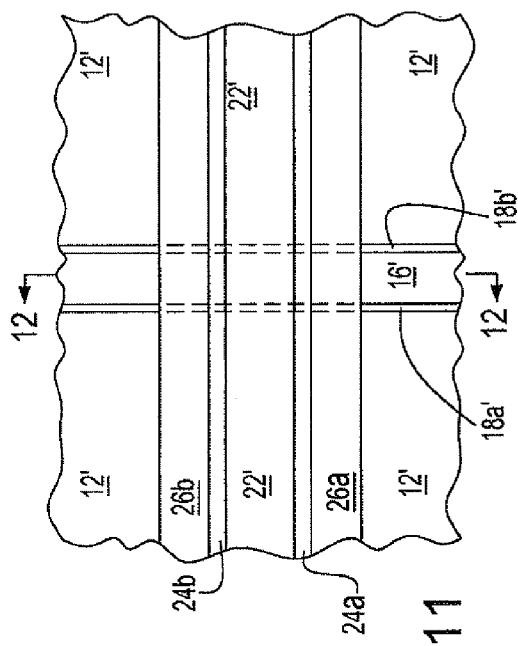
Figure 12:
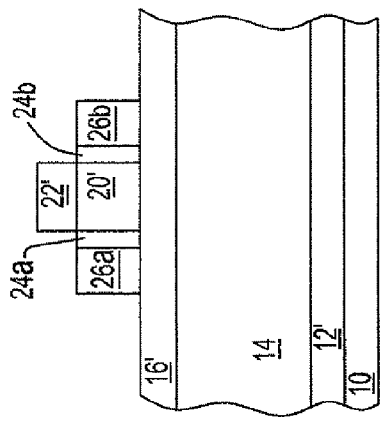

FIG. 11 and FIG. 12 show a pair of schematic cross-sectional and plan-view diagrams illustrating the results of further processing of the semiconductor structures whose schematic cross-sectional and plan-view diagrams are illustrated in FIG. 9 and FIG. 10.

FIG. 11 and FIG. 12 show a pair of laterally grown gate electrodes 26a and 26b located laterally adjacent (and adjoining) the pair of laterally grown first spacer material layers 24a and 24b.

The pair of laterally grown gate electrodes 26a and 26b is formed of a conductor material. Exemplary but not limiting conductor materials include platinum, tantalum, and in particular tantalum nitride, conductor materials. Other nitride conductor materials and related alternative silicide conductor materials are common and are also disclosed in greater detail above. Typically each of the pair of laterally grown gate electrodes 26a and 26b comprises a metal nitride, preferably tantalum nitride, gate electrode material that has a linewidth from about 200 to about 500 angstroms.

In order to efficiently grow the pair of laterally grown gate electrodes 26a and 26b laterally upon the pair of laterally grown first spacer material layers 24a and 24b, an additional activation of the pair of laterally grown first spacer material layers 24a and 24b is often desirable. Such an additional activation of the pair of laterally grown first spacer material layers 24a and 24b may be effected by treatment thereof with an alkyl aluminum activant followed by subsequent treatment thereof with ammonia to again provide an amine rich surface. Other alkyl metal activants may also be used. Particular alkyl aluminum activants may include, but are not limited to: trimethyl aluminum, triethyl aluminum and tributyl aluminum. Activation of the pair of laterally grown first spacer material layers 24a and 24b with the alkyl aluminum activant may be effected using any of several methods. Non-limiting examples include vapor immersion methods and solution immersion methods. Vapor immersion activation is preferred, and it may be effected at about room temperature and room pressure while using an alkyl aluminum activant concentration from about 0.1 to about 3 volume percent in an inert carrier gas flow from about 100 to about 1000 standard cubic centimeters per minute. Subsequent ammonia treatment and nitrogenation may also be effected using several methods, but gas phase treatment is preferred for this process step also.

Ammonia gas treatment may be undertaken at room temperature and room pressure with a pure ammonia gas flow rate from about 1 to about 10 cubic centimeters per minute.

Figure 14:
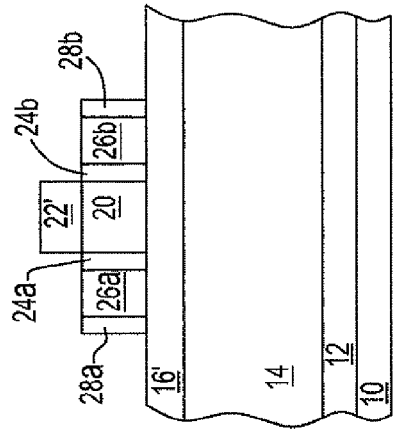
Figure 13:
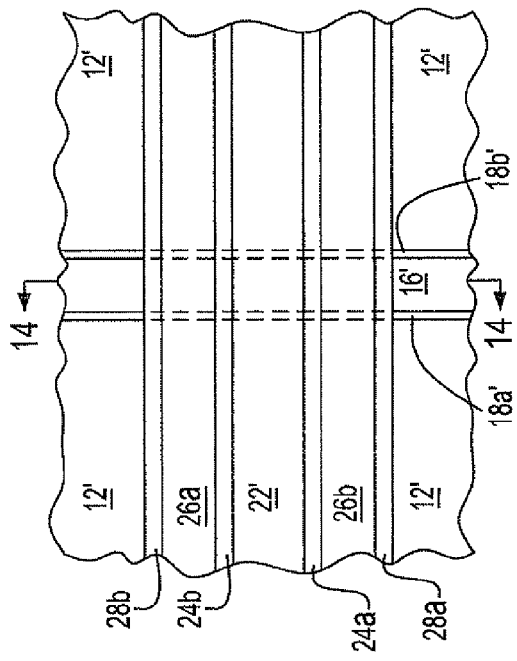

FIG. 13 and FIG. 14 show a pair of schematic cross-sectional and plan-view diagrams illustrating the results of further processing of the semiconductor structure whose schematic cross-sectional and plan-view diagrams are illustrated in FIG. 11 and FIG. 12.

FIG. 13 and FIG. 14 further illustrate a pair of laterally grown second spacer material layers 28a and 28b located laterally adjacent (and adjoining) the pair of laterally grown gate electrodes 26a and 26b.

The pair of laterally grown second spacer material layers 28a and 28b is laterally grown using the same methodology and materials that are used when growing the pair of laterally grown first spacer material layers 24a and 24b. The pair of laterally grown second spacer material layers 28a and 28b is grown upon the pair of laterally grown gate electrodes 26a and 26b. The pair of laterally grown gate electrodes 26a and 26b preferably comprises a conductor nitride material, such as a tantalum nitride material deposited using an atomic layer deposition method. For example, the atomic layer deposition method may use an imido tantalum or tantalum amide source material, either by itself or in conjunction with an ammonia nitrogen source material. Under certain circumstances, the pair of laterally grown gate electrodes 26a and 26b may be activated while using only a metal alkyl treatment as disclosed above, since an ammonia reactant comprises a part of the laterally grown gate electrode 26a and 26b deposition process. Preferably, each of the laterally grown second spacer material layers 28a and 28b comprises a silicon oxide material having a lateral thickness from about 50 to about 200 angstroms and deposited using a vapor deposition method, such as in particular a atomic layer deposition method.

Figure 16:
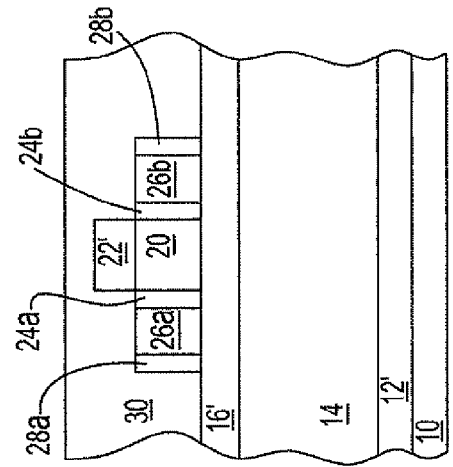
Figure 15:
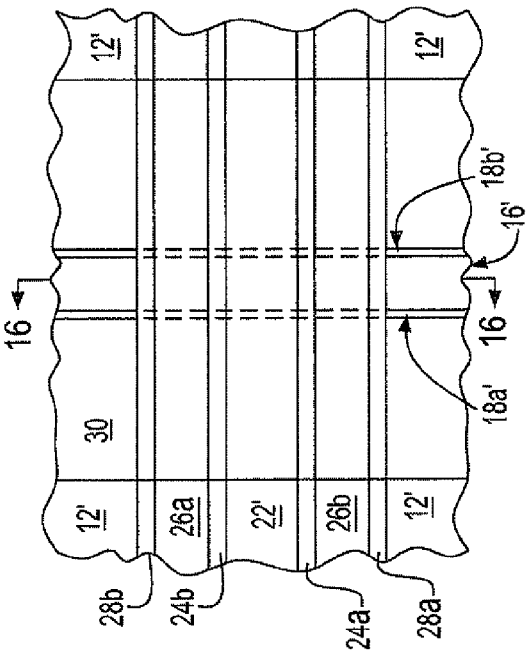

FIG. 15 and FIG. 16 show a pair of schematic cross-sectional and plan-view diagrams illustrating the results of further processing of the semiconductor structure whose schematic cross-sectional and plan-view diagrams are illustrated in FIG. 13 and FIG. 14.

FIG. 15 and FIG. 16 show a patterned photoresist layer 30 located upon a central portion of the passivated patterned capping layer 22' (and activated patterned mandrel layer 20' aligned therebeneath), the pair of laterally grown first spacer material layers 24a and 24b, the pair of laterally grown gate electrodes 26a and 26b and the pair of laterally grown second spacer material layers 28a and 28b. End portions of the foregoing capping layer, spacer layers and gate electrodes are left exposed by the patterned photoresist layer 30 so that they may be further processed in accordance with the instant embodiment.

The patterned photoresist layer 30 may comprise any of several photoresist materials that are conventional in the semiconductor fabrication art. Non-limiting examples include positive photoresist materials, negative photoresist materials and hybrid photoresist materials. Typically, the patterned photoresist layer has a thickness from about 5000 to about 10000 angstroms so that it may optimally cover a complete thickness of all features and layers that it is required to cover. The patterned photoresist layer 30 is typically formed using conventional photoresist processing methods and apparatus. The methods and apparatus may include, but are not limited to spin coating, photoexposure and development methods and apparatus that are conventional in the semiconductor fabrication art.

Figure 18:
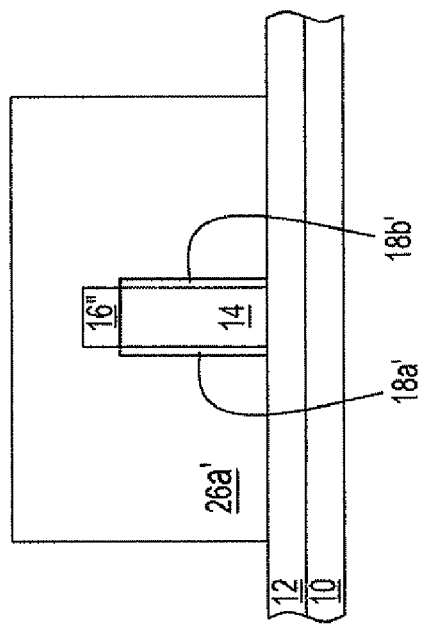
Figure 17:
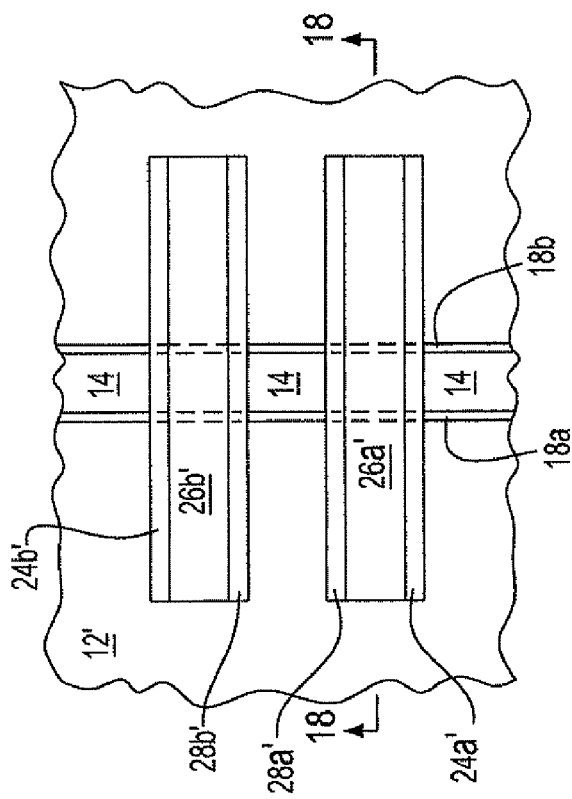

FIG. 17 and FIG. 18 show a pair of schematic cross-sectional and plan-view diagrams illustrating the results of further processing of the semiconductor structure whose schematic cross-sectional and plan-view diagrams are illustrated in FIG. 15 and FIG. 16.

FIG. 17 and FIG. 18 show a pair of patterned first spacer layers 24a' and 24b', a pair of patterned gate electrodes 26a' and 26b' and a pair of patterned second spacer layers 28a' and 28b'. The foregoing patterned spacer layers and patterned gate electrodes are formed incident to patterning of the corresponding laterally grown first spacer material layers 24a and 24b, the laterally grown gate electrodes 26a and 26b and the laterally grown second spacer material layers 28a and 28b. The patterning is effected while using the patterned photoresist layer 30 as illustrated in FIG. 15 and FIG. 16 as a mask, along with particular etch methods that are conventional in the semiconductor fabrication art. The etch methods may include, but are not limited to, dry plasma etch methods and wet chemical etch methods. Under certain circumstances, fluorine containing etchant gas compositions may be used to etch both silicon oxide materials and tantalum nitride conductor materials although the embodiment is not limited to use of only a single etchant gas or a single plasma etch method.

Subsequent to patterning of the pair of laterally grown first spacer material layers 24a and 24b, the pair of laterally grown gate electrodes 26a and 26b and the pair of laterally grown second spacer material layers 28a and 28b, each of the patterned photoresist layer 30, the passivated patterned capping layer 22' and the passivated patterned mandrel layer 20' and exposed portions of the passivated patterned hard mask layer 16' is stripped from the semiconductor structure that is illustrated in FIG. 15 and FIG. 16 to provide in part the semiconductor structures that are illustrated in FIG. 17 and FIG. 18. The foregoing layers may be stripped while using methods and materials that are conventional in the semiconductor fabrication art. An appropriate photoresist stripping material may be used to strip the patterned photoresist layer 30. The passivated patterned capping layer 22' and exposed portions of the passivated patterned hard mask layer 16' may be stripped while using a plasma stripping method. Residual sections of a doubly patterned hard mask layer 16" remain interposed between the patterned gate electrodes 26a' and 26b', and the semiconductor fin 14. Other etchants may also be used. The activated patterned mandrel layer 20' may typically be stripped while using a solvent stripping method or an oxygen plasma stripping method. As a result of the foregoing stripping treatments, the passivated dielectric layer 12' and the passivated gate dielectric layers 18a' and 18b' may be returned to an unpassivated state, as illustrated in FIG. 17 and FIG. 18.

FIG. 17 and FIG. 18 show a pair of schematic cross-sectional and plan-view diagrams illustrating a finFET structure in accordance with the preferred embodiment of the invention. The finFET structure comprises a semiconductor fin 14 located upon a substrate 12 and having a pair of gate dielectric layers 18a and 18b located upon a pair of opposite sidewalls of the semiconductor fin 14. The finFET structure further comprises, for example, a laterally grown patterned gate electrode 26a' that traverses the semiconductor fin 14 and the pair of gate dielectric layers 18a and 18b. Finally, the finFET structure also comprises a pair of spacer layers (i.e., patterned first spacer layer 24a' and patterned second spacer layer 28a') located and formed adjacent the laterally grown patterned gate electrode 26a'. The foregoing pair of spacer layers is located completely covering a sidewall of the patterned gate electrode 26a', but not completely covering a sidewall of the semiconductor fin 14 remote from the laterally grown patterned gate electrode 26a'.

The finFET structure of FIG. 17 and FIG. 18 uses a laterally specific (i.e., sidewall specific) vapor deposition method for forming the pair of patterned first spacer layers 24a' and 24b', the pair of patterned gate electrodes 26a' and 26b', and the pair of patterned second spacer layers 28a' and 28b'. By using such a method, each of the patterned first spacer layers 24a' and 24b', the patterned gate electrodes 26a' and 26b' and the patterned second spacer layers 28a' and 28b' may be formed with a linewidth less than a minimum photo resolvable linewidth. In addition, by using the laterally specific deposition method, the patterned gate electrodes 26a' and 26b' are formed absent a photolithographic method that requires photo registration over layers and structures having substantial topography. Thus, a finFET structure in accordance with the preferred embodiment of the invention is fabricated with enhanced manufacturability.

Although the preferred embodiment of the invention illustrates the invention within the context of forming a spacer clad gate electrode for a finFET device, the invention is not intended to be so limited. Rather in a most general sense, the invention provides a method for forming laterally grown structures of several varieties within a microelectronic structure that is typically a semiconductor structure. Laterally grown structures that may be formed using the method include, but are not limited to: conductor structures, semiconductor structures and dielectric structures.

The preferred embodiment of the invention is illustrative of the invention rather than limiting of the invention. Revisions and modifications may be made to methods, materials, structures and dimensions of a finFET structure and methods for fabrication thereof in accordance with the preferred embodiment of the invention, while still providing a structure and methods for fabrication thereof in accordance with the invention, further in accordance with the accompanying claims.

What is claimed is:

1. A method for fabricating a structure comprising:
   forming a mandrel layer over a substrate, where a sidewall of the mandrel layer is activated with respect to vapor deposition of a material layer upon the sidewall of the mandrel layer while a surface of the substrate is passivated with respect to vapor deposition of the material layer upon the surface of the substrate; and
   vapor depositing and selectively laterally growing the material layer upon the sidewall of the mandrel layer but not upon the surface of the substrate.

2. The method of claim 1 wherein the step of forming the mandrel layer over the substrate comprises forming the mandrel layer that comprises a maleic anhydride material over the substrate.

3. The method of claim 1 wherein the step of forming the mandrel layer over the substrate, where the sidewall of the mandrel layer is activated with respect to vapor deposition of a material layer upon the sidewall of the mandrel layer comprises forming the mandrel layer over the substrate, where the sidewall of the mandrel layer is activated with respect to vapor deposition of a material layer upon the sidewall of the mandrel layer by using at least one of an organic acid, hydroxyl and amine activant.

4. The method of claim 1 wherein the step of forming the mandrel layer over the substrate comprises forming the mandrel layer over the substrate that comprises a silicon oxide surface.

5. The method of claim 1 wherein the step of forming the mandrel layer over the substrate, where the surface of the substrate is passivated with respect to vapor deposition of a material layer upon the surface of the substrate comprises forming the mandrel layer over the substrate, where the surface of the substrate is passivated with respect to vapor deposition of a material layer upon the surface of the substrate by using a substituted silane passivant.

6. The method of claim 1 wherein the step of vapor depositing and selectively laterally growing the material layer upon the sidewall of the mandrel layer but not upon the surface of the substrate comprises vapor depositing and selectively laterally growing the material layer that comprises a dielectric material upon the sidewall of the mandrel layer but not upon the surface of the substrate.

7. The method of claim 1 wherein the step of vapor depositing and selectively laterally growing the material layer upon the sidewall of the mandrel layer but not upon the surface of the substrate comprises vapor depositing and selectively laterally growing the material layer that comprises a conductor material upon the sidewall of the mandrel layer but not upon the surface of the substrate.

8. The method of claim 1 wherein the step of vapor depositing and selectively laterally growing the material layer upon the sidewall of the mandrel layer but not upon the surface of the substrate comprises vapor depositing and selectively laterally growing the material layer that comprises a lateral laminate of a dielectric material and a conductor material upon the sidewall of the mandrel layer but not upon the surface of the substrate.

9. The method of claim 1 wherein the step of vapor depositing and selectively laterally growing the material layer upon the sidewall of the mandrel layer but not upon the surface of the substrate comprises vapor depositing and selectively laterally growing the material layer that comprises a gate electrode upon the sidewall of the mandrel layer but not upon the surface of the substrate.

10. The method of claim 1 wherein the step of vapor depositing and selectively laterally growing the material layer upon the sidewall of the mandrel layer but not upon the surface of the substrate comprises vapor depositing and selectively laterally growing the material layer that comprises a gate electrode within a finFET upon the sidewall of the mandrel layer but not upon the surface of the substrate.

* * * * *